United States Patent [19]

Girgis et al.

[11] 4,319,329
[45] Mar. 9, 1982

[54] FREQUENCY MEASURING AND MONITORING APPARATUS, METHODS AND SYSTEMS

[75] Inventors: Adly A. Girgis; Fredric M. Ham, both of Ames, Iowa

[73] Assignee: Iowa State University Research Foundation, Inc., Ames, Iowa

[21] Appl. No.: 123,213

[22] Filed: Feb. 21, 1980

[51] Int. Cl.³ .................. G06F 15/56; G01R 23/16
[52] U.S. Cl. .................. 364/484; 324/77 B; 324/78 D; 364/576; 361/78
[58] Field of Search .............. 364/493, 483, 484, 485, 364/900, 576; 361/80–84, 67, 68, 78; 324/77 B, 77 C, 77 CS, 78 D, 78 R, 78 Z

[56] References Cited

U.S. PATENT DOCUMENTS

| | | | |
|---|---|---|---|
| 3,544,775 | 12/1970 | Bergland et al. | 364/576 |
| 3,755,734 | 8/1973 | Blamyer | 324/78 Z |
| 3,851,162 | 11/1974 | Munoz | 364/576 X |
| 3,881,097 | 4/1975 | Lehmann | 364/485 X |
| 3,973,112 | 8/1976 | Sloane | 324/77 B X |
| 4,057,756 | 11/1977 | Ley et al. | 324/77 B |
| 4,060,716 | 11/1977 | Pekrul et al. | 364/576 |
| 4,090,133 | 5/1978 | Klyce et al. | 324/78 D X |
| 4,135,243 | 1/1979 | Peregrino et al. | 364/484 |

FOREIGN PATENT DOCUMENTS 599226 2/1978 U.S.S.R. .

OTHER PUBLICATIONS

Use Of The Discrete Fourier Transform In The Measurement of Frequencies and Levels of Tones, Rife & Vincent, The Bell System Technical Journal, Feb. 1970, pp. 197–205.

High–Accuracy Analog Measurements Via Interpolated FFT, Jain, et al., IEEE Transactions on Instrumentation Measurement, vol. IM-28, No. 2, Jun. 1979, pp. 113–122.

Load–Shedding And Frequency Relaying, E. A. Udren, Applied Protection Relaying, Westinghouse Electric Corp., Newark, 1976, pp. 21-1 to 21-16.

One–Line Relaying With a Digital Computer, Gilcrest, et al., Silent Sentinels, RPL 71-3, Aug. 1971, pp. 1–17.

*Primary Examiner*—Edward J. Wise
*Attorney, Agent, or Firm*—James F. Hollander

[57] ABSTRACT

Waveform frequency measuring apparatus and methods utilizing zero-crossing triggered analog-to-digital conversion apparatus combined with Discrete Fourier Transform (DFT) digital computing apparatus accomplish measurement of waveform fundamental frequency using hitherto disadvantageous leakage of the Discrete Fourier Transform.

In an example, the frequency measuring apparatus and methods are used in an alternating current (AC) electrical power system for measuring and monitoring frequency deviation $\Delta f$ from the nominal system frequency f and actuating protective relaying when the frequency deviation is excessive.

21 Claims, 6 Drawing Figures

FIG.1

FREQUENCY DEVIATION METER 1

SIMPLIFIED FLOW CHART 60

FREQUENCY MEASURING AND MONITORING APPARATUS, METHODS AND SYSTEMS

BACKGROUND OF THE INVENTION

The present invention relates to methods and apparatus for measuring and monitoring the frequency of alternating current (AC). More specifically, the present invention relates to methods and apparatus for converting analog values of the alternating current to digital form and then electronically performing Fourier transform computations to provide frequency measurements, monitoring and protection in frequency-sensitive systems. The invention also relates to electrical system utilizing Fourier-transform-based monitoring and protection methods and apparatus.

Hitherto it has been proposed to sample the analog AC waveform and compute the Discrete Fourier Transform (DFT) on the waveform to obtain frequency information. However, sampling over many cycles of the waveform has been involved in the prior art in order to obtain reasonable accuracy of frequency measurement, thus limiting the swiftness with which frequency measurement can be accomplished by the Fourier transform technique. Discussions of the Discrete Fourier Transform have also recognized as disadvantage in that the calculation process itself introduces a phenomenon known as "leakage" which causes spurious indications of d.c. (zero frequency) and harmonic content in a waveform which is actually a single-frequency sinusoid only. Thus, the Discrete Fourier Transform has been recognized to have complications which make it difficult to use for frequency measurement.

On the other hand, the need for and commercial potential of inexpensive frequency-measuring apparatus is increasing with each passing year. For example, in the electrical power generation, transmission, and distribution fields a decrease in the frequency of the AC electric power waveform can indicate excessive loading of the generating equipment by increased energy consumption. In order to prevent catastrophic blackout occurrences, electric power systems must be provided with means of detecting such decreases in frequency and shedding load in an effective manner until the systems can adjust to the changed loading conditions. Frequency-measuring devices for monitoring and keeping records on the performance of power systems are also necessary for proper maintenance and planning of such systems.

The DFT can be electronically computed in a manner efficient of time by means of any of a class of algorithms known as the Fast Fourier Transform (FFT). With the advent of large-scale-integration (LSI) computer chips with substantial digital computing power in truly miniature dimensions at attractively low expense, the DFT could be calculated were it not for the recognized practical and inherent disadvantages that have hitherto deterred its use in the frequency measuring and monitoring field.

SUMMARY OF THE INVENTION

In the present invention it has been discovered that the phenomenon known as leakage in the Discrete Fourier Transform (DFT) can be turned to advantage for high-accuracy frequency measurements on single cycles of single-frequency sinusoidal waveforms. Triggered analog-to-digital conversion equipment is combined with a DFT computing apparatus so that predictable leakage occurs with a given frequency excursion, or deviation $\Delta f$, from a reference frequency $f$. Then when the invention is used to measure a waveform with unknown frequency deviation $\Delta f$, the amount of leakage which occurs can be used as an indicator of frequency deviation for actuating protective relaying equipment. Moreover, the leakage can also be used as an intermediate quantity in further computations programmed into the computer to recover or determine what the frequency deviation $\Delta f$ of the unknown waveform must be. The operating characteristics of the analog-to-digital conversion equipment and the computations performed by the digital computing equipment are arranged in the invention so that the combination of the conversion equipment and computer equipment synergistically operates as a remarkably rapid, reliable means of determining frequency deviation from the reference frequency $f$. A balance in the roles assigned to (A) expense in hardware conversion equipment and computing equipment and (B) to time in software execution is made possible. Accurate measurement of frequency deviation can now be obtained from data on only one cycle of the unknown waveform by DFT technique.

The invention recognizes that in general an AC waveform has a fundamental wave of lowest frequency and also has harmonics which are multiples of the fundamental frequency and DC or zero-frequency content. After the harmonics and DC are filtered out, as by a transformer and low pass filter, the fundamental wave is a single-frequency sine wave with positive peaks and negative troughs. The frequency of the fundamental wave is to be measured, and the period of a wave is the time for one cycle to be executed which is the reciprocal of the frequency or unity divided by the frequency. In between the peaks and troughs, the voltage or current of the wave is momentarily zero periodically as the voltage (or current) values, known as analog values, change in time from negative to zero and then to positive, and vice-versa. The inbetween point of zero voltage (or current) are known as "zero-crossings."

In order to make DFT leakage predictable in relation to any or each frequency deviation $\Delta f$ of the single-frequency unknown wave, the invention provides for the analog-to-digital conversion apparatus to operate as follows. A number n of digital representations of voltage (or current) suitably in binary collections, bytes, or words suitable for processing by the digital computer apparatus, are produced corresponding to the same number n of electrical analog values of the wave suitably spaced at intervals of time equal to the reciprocal of n times the reference frequency f or $1/(nf)$ and occurring during a time period of $1/f$ of the reference frequency. The production of the digital representations is triggered by a zero-crossing detector so that one of the digital representations corresponds to a timewise first one of the analog values located a time interval $\Delta t$ seconds (or $f\Delta t$ cycles of the reference frequency) relative to the zero-crossing nearest in time to the triggering signal.

The analog-to-digital conversion apparatus suitably is provided as hardware that takes data on the unknown fundamental frequency wave so that the time interval $\Delta t$, the number n and the reference frequency f are constants for each cycle measured. Then the computing equipment is programmed for accurate measurements of frequency deviation $\Delta f$ based on the assumption of constancy in the time interval $\Delta t$, number n and frequency f. Alternatively, the conversion apparatus operates on the unknown waveform in such a way that the time interval $\Delta t$ is repetitively measured and fed to the computing apparatus with the digital representations so that the computing apparatus takes the time relationship $\Delta t$ into account and performs or interprets its leakage calculation accordingly. Likewise, where the application requires, the sample number n and the reference frequency f are made changeable in the conversion apparatus and the computing apparatus is fed updated constants n and f.

The digital representations produced by the analog-to-digital conversion apparatus are fed to a digital computing apparatus suitably having a Fast Fourier Transform (FFT) capability for efficiently computing the DFT. Due to the phenomenon of leakage the computing apparatus calculates nonzero spectral intensities, or X coefficients, at DC, the reference frequency f, twice the reference frequency (first harmonic), three times the reference frequency (second harmonic), and so on. Harmonic and DC content spuriously results from the FFT calculation when there is frequency deviation of the unknown wave from the standard frequency f. (Strictly speaking, even the calculated content at the reference frequency f is spurious when the unknown wave departs from frequency f.) Only when the unknown wave is precisely identical in frequency to the reference frequency f does the spurious DC and harmonic content vanish in the results of the FFT calculations. The spurious DC and harmonic content increases in overall amount, or total magnitude, the greater the frequency of the unknown wave departs from the reference frequency f. The amount of the harmonic and DC content is predictably related to the deviation $\Delta f$ in frequency of the unknown when the timing $\Delta t$, reference frequency f, and number n of the converting apparatus is known, as the invention recognizes and provides.

Specifically, the amount of the harmonic content is quantified as a "leakage coefficient." A variety of formulations of a leakage coefficient are possible. An illustrative and advantageous leakage coefficient $\eta$ (eta) is taken as the ratio of the sum of the magnitudes of the DFT coefficients for the DC component and all of the harmonics divided by the magnitude of the DFT coefficient for the frequency component corresponding to the reference frequency f. Conveniently the leakage coefficient $\eta$ is linearly proportional to the frequency deviation of the unknown wave for all practical purposes, saving computation time. The constant of the proportionality turns out to be dependent on the normalized interval $f\Delta t$ and on the number n. Thus, by providing the triggered analog-to-digital conversion apparatus in conjunction with leakage coefficient computing apparatus the invention offers advantageous means and methods of detecting and monitoring frequency deviation $\Delta f$ and measuring it quantitatively.

The invention commends itself to a variety of frequency measuring and monitoring applications. Measurement of AC power system frequency is one such. The measurement of any oscillatory physical phenomenon from which can be generated an electrical analog is available, for example in measuring shaft speed of rotating machinery by optical-electronic, acoustic-electronic, and other tachometric apparatus. In applications in which a waveform to be detected is expected to be two-tone or multitone, as in the telephone and other commuications industries, filtering means are suitably provided to isolate each tone and the invention compares each tone with a reference by computation of a respective leakage coefficient.

Automatically frequency-searching frequency measurement apparatus is readily provided in which the standard or reference frequency f is searchably changed among a variety of standard values until the unknown wave is sufficiently close in frequency to permit high-accuracy measurement of the frequency deviation $\Delta f$ from the closest reference frequency f by the methods of the present invention. Synchronizing an unknown frequency source with a standard or synchronizing a first unknown with a second unknown is readily accomplished by the invention since the leakage coefficient has a convenient sharp null when the two frequencies are identical.

The characteristic of the leakage coefficient being zero at the reference frequency f permits the use of the invention in the form of feedback-stabilized frequency-generating apparatus wherein the leakage coefficient, or the frequency deviation computed therefrom, is used as an error signal. Generating apparatus is provided with means of adjusting the actual frequency thereof in response to the error signal produced by monitoring apparatus coupled to the generator and using the triggered A/D conversion and DFT leakage computation method of the invention. Contemplated forms of such frequency-stabilized equipment advantageously range in size from the miniature dimensions of light electronic equipment to the ponderously macroscopic dimensions of electrical power generation protective relaying systems.

In the relatively specific context of the AC electrical power system protective relaying art, the invention offers an attractive new alternative means for controlling and stabilizing the frequency deviation of the fundamental frequency of the system AC waveform from the nominal 60 Hz. or 50 Hz. When the frequency deviation exceeds a given threshold value, protective measures can be and are initiated by comparing the measured frequency deviation, or the leakage coefficient itself, with a stored threshold quantity and generating a monitor pulse or alarm signal. Conveniently, several threshold magnitudes can be stored so that different protective measures are initiated by the same protective apparatus depending upon the amount of departure from the nominal system frequency. The invention contemplates systems involving load-shedding circuit breakers having and being automatically controlled by leakage coefficient frequency deviation monitoring. The invention is suitably configured and provided at power generating station systems, system interties, substations and other installations for frequency monitoring and protective control of power systems.

DETAILED DESCRIPTION OF THE DRAWING

Figure 1:
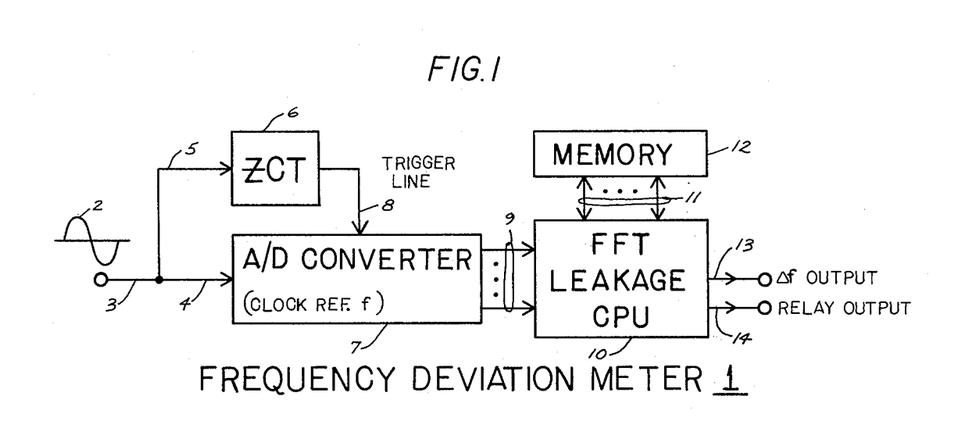
FIG. 1 is a block diagram of frequency measuring and monitoring apparatus of the invention.
Figure 2:
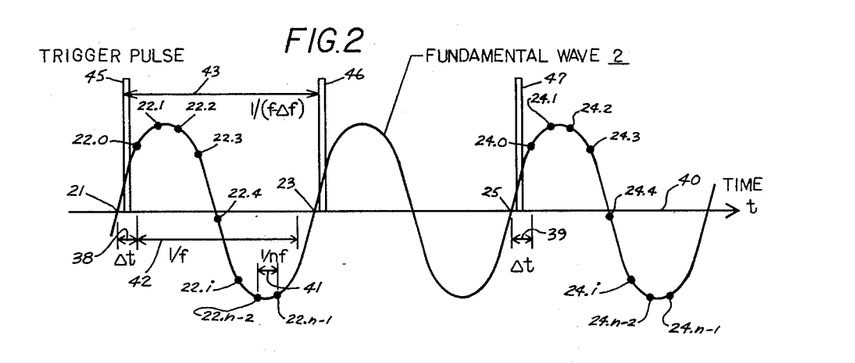
FIG. 2 is a graph of three cycles of a fundamental wave having a frequency deviation $\Delta f$ to be measured by the apparatus of FIG. 1. The graph indicates how the points to be sampled are related in time to the zero-crossings and the trigger pulses. The ordinate is an electrical quantity such as voltage or current, and the abscissa is time t.

Referring to FIGS. 1 and 2 a single-frequency sinusoidal waveform 2 is provided at input line 3 of inventive frequency deviation meter 1. The waveform 2 is carried along lines 4 and 5 to analog-to-digital (A/D) converter 7 and zero-crossing trigger circuit 6. A series of trigger pulses 45, 46, and 47 is provided by circuit 6 along trigger line 8 after every positive-going zero-crossing 21, 23, and 25 sensed on waveform 2.

A time interval 38 of $\Delta t$ seconds has elapsed after the zero-crossing 21 when the A/D converter 7 in response to the trigger pulse 45 converts the timewise first analog value 22.0 to a digital representation. Analog value 22.0 is succeeded by values 22.1, 22.2, 22.3, 22.4, . . . 22.i, . . . 22.n−2, and 22.n−1 which are successively converted to digital representations. It is to be understood that while waveform 2 has an infinity of analog values, the invention selects groups of only the whole number n of them for conversion to digital representations. The analog voltage values converted are equally spaced in time with a spacing 41 of $1/(nf)$, which is one-nth of the period 42 of the reference frequency f (and not the period 43 of the unknown waveform 2). Thus, the analog values 22.0, . . . 22.n−1, being n in number, all occur during a period $1/f$, the reciprocal of the reference frequency f. The mathematical symbols for the analog values which the digital representations encode are $V(0), V(1), V(2), V(3), V(4), \ldots V(i), \ldots V(n-2)$, and $V(n-1)$, where n is at least 4 and is divisible by 2 and is preferably a power of 2 such as 4, 8, 16, 32, 64, 128, etc.

After the cycle containing the values 22, the conversion apparatus 6,7 in this preferred embodiment waits for a cycle and ignores trigger pulse 46. Then in response to trigger pulse 47 the next set of analog electrical values 24.0, 24.1, 24.2, 24.3, 24.4, . . . 24.i, . . . 24.n−2, and 24.n−1 are converted to digital representations. Waiting for a cycle leaves time for computations to be performed in a manner and by computer apparatus described hereinbelow. The zero-crossing trigger circuit and A/D converter combination 6,7 is constructed so that the time delay 38 and 39 after a zero-crossing until the first value 22.0 or 24.0 converted is always the same. This means that the fraction of a cycle of the reference frequency f by which the first analog value succeeds its zero-crossings is also always the same constant $f\Delta t$. In electrical degrees each first analog value such as 22.0 or 24.0 is delayed by a constant $360° \cdot f\Delta t$ relative to the zero-crossing 21 or 25 nearest the triggering pulse signal 45 or 47 initiating the conversion of that first value. For clarity in FIG. 2 the intervals $\Delta t$ (38 and 39) are enlarged compared to the relatively negligible intervals actually occurring in the apparatus of FIG. 4 which triggers substantially exactly at the zero-crossings 21, 25. Also, the trigger pulses 45, 47 of FIG. 2 are for clarity shortened in duration or length compared to those actually generated in the FIG. 4 apparatus by trigger circuit 6.

The time 43 between trigger pulses 45 and 46 is equal to the period of the unknown waveform 2 between successive positive-going zero-crossings, and is related to the reference frequency f by the expression $1/(f-\Delta f)$ where $\Delta f$ is the unknown frequency deviation to be measured. The time 43 is not a constant for every cycle of the unknown waveform being measured since the unknown waveform is in general changing in frequency over time.

The digital representations pass from A/D converter 7 along buss 9 in groups numbering n and are fed to and received by the Discrete Fourier Transform (DFT)-leakage central processing unit (CPU) 10 which stores them in its memory 12 connected to CPU 10 by buss 11.

Electronic Computation of DFT Leakage

Figure 3:
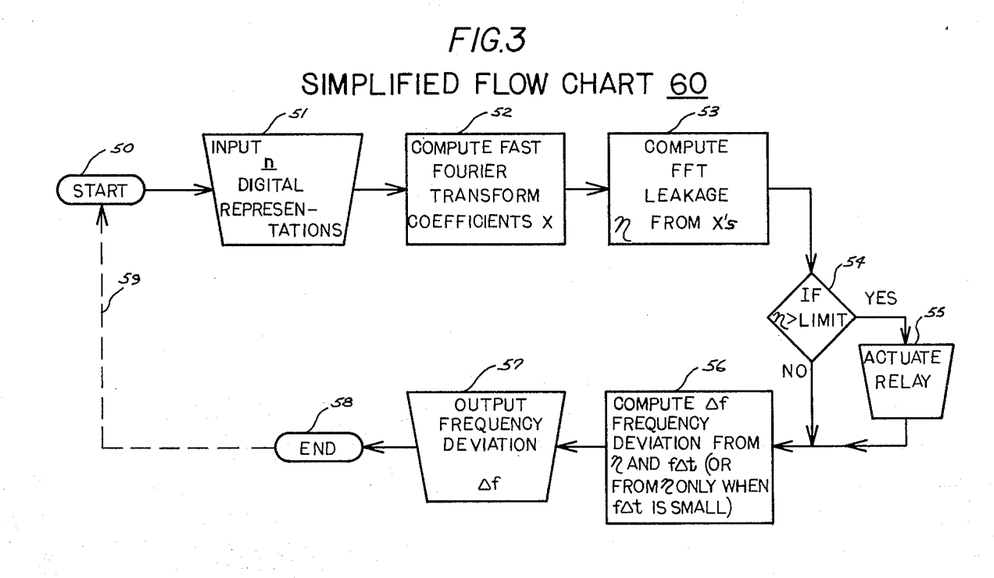
FIG. 3 is a simplified flowchart of a computer program for use in the FFT leakage central processing unit portion of the inventive combination of FIG. 1.

The DFT leakage CPU 10 operates according to a stored program suggested in FIG. 3 by simplified flow chart 60. The program starts execution at point 50 and inputs each group of n digital representations in step 51. Then it computes the frequency spectrum intensity components, or X components, of the DFT at step 52 by the swift computational technique known as the Fast Fourier Transform (FFT). The X components are the magnitudes of the complex numbers describing the spectral lines at DC (zero frequency), the reference frequency f, first harmonic 2f, second harmonic 3f, and so on.

It is recalled that the wave 2 is single-frequency and sinusoidal near the reference frequency f. Its true spectrum, theoretically, is simply a line near but not at frequency f, that is , the spectrum of the Continuous Fourier Transform (CFT) is a single line at $f-\Delta f$. Notwithstanding this, the DFT spuriously calculates the fundamental frequency wave 2 and interprets same as having substantial spectral content at the reference frequency f itself, and lesser amounts at DC and the harmonics 2f, 3f, and so on. This phenomenon is called leakage and hitherto has been considered to be a disadvantage of the DFT for frequency measuring applications. In the invention, however, the spurious frequency content calculations are turned to advantage since they are recognized to be related to the unknown frequency deviation $\Delta f$.

In somewhat more technical terms, "leakage" refers to the apparent spreading of energy from one frequency into adjacent ones; it arises due to the truncation of the time sequence such that a fraction of a cycle of waveform 2 exists in that waveform being subjected to the FFT. This is somewhat different than in the CFT on only one cycle, where just by virtue of the fact that the waveform is truncated, whether it is a fraction of a cycle or not, leakage will occur. It is probably easier to comprehend this in the frequency domain; here the actual transform obtained is the convolution of two transforms viz. those of the window function, usually rectangular, and the desired waveform. For example, if a cosine waveform is truncated such that an integer number of cycles exists, the result in the frequency domain would be the convolution of a sine function with a double impulse function. If the FFT, however, if there exists exactly an integer number of cycles of the truncated time sequence, no leakage will occur. This is true because the DFT periodically extends the sequence.

A direct use of the FFT on discretized data would yield false results if any deviation in the single-frequency sinusoid from the reference frequency did exist. For example, this can be easily appreciated by considering a pure 60 Hz. sine waveform sampled at a frequency of 1920 Hz., so that the number of samples n in one cycle is 32. The magnitude of the FFT has just one component $X_1$ at 60 Hz. Now if the frequency deviates to 59 Hz. the fundamental component still appears to be at 60 Hz., and the DC and all harmonics are nonzero. The underlying reason is that the frequency domain is discrete, as is the time domain in the DFT, and the resolution in the frequency domain is only 60 Hz. In order to resolve the component at 59 Hz., the sampling frequency in prior conceptions should have been changed to 59×32 Hz; but this would mean that one had prior knowledge of the degree of deviation in the frequency, and there would be no need for a detection scheme.

Solution to the problem can be obtained through the phenomenon of leakage. First of all, it is recalled that the X coefficients of the Discrete Fourier Transform (DFT) are the absolute values, or magnitudes, of the complex number summations of the DFT for each multiple k of the reference frequency f, the summations being defined for general k as follows:

$$X(k) = \left| \sum_{i=0}^{n-1} V(i)e^{-j(2\pi/n)ik} \right| \tag{1}$$

The X coefficients which are of interest here are $X(0)$ which is the DC component, $X(1)$ which is the reference frequency component, $X(2)$ which is the first harmonic component, $X(3)$ which is the second harmonic component, and so on up to $X((n/2)-1)$ which is the highest harmonic component to be considered.

We define a parameter, to be called the leakage coefficient $\eta$ as the ratio of the magnitudes of the DC component and the harmonics added up, to the magnitude of the reference frequency component thus:

$$\eta = \left[ \left( \sum_{k=0}^{(n/2)-1} X(k) \right) - X(1) \right] / X(1) \tag{2}$$

Equation (2) is the mathematical definition of the leakage coefficient $\eta$, and substituting Equation (1) into Equation (2) yields the following definition of leakage coefficient in terms of the electrical values sampled from waveform 2 in FIG. 2:

$$\eta = \frac{\sum_{k=0}^{(n/2)-1} \left| \sum_{i=0}^{n-1} V(i)e^{-j(2\pi/n)ik} \right|}{\left| \sum_{i=0}^{n-1} V(i)e^{-j(2\pi/n)i} \right|} - 1 \tag{3}$$

Since the leakage coefficient $\eta$ is defined for only frequency content of the original waveform 2 being a single-frequency sinusoid, it is clear that an unknown waveform is advantageously low-pass filtered to remove true harmonic content so that the spurious harmonic content calculated by the DFT is isolated. Likewise, any true DC content is removed, such as by a coupling transformer. Then when the leakage coefficient is zero, the conclusion follows that the unknown waveform has not deviated from the reference frequency f. Whenever the unknown waveform deviates from f, however, the leakage coefficient will be and is nonzero. This method, therefore, does not necessitate modifying the sampling frequency in order to resolve the amount of frequency deviation. On the contrary, the DFT computer apparatus 10, 12 in synergistic combination with the zero-crossing triggered A/D converter apparatus 6,7 spuriously but advantageously calculates leakage coefficient content which increases in magnitude with increasing departure $\Delta f$ from the reference frequency f.

CPU 10 is programmed by a person skilled in the art with the calculation procedure for the leakage coefficient $\eta$ defined in equations (2) and (3) or any other suitable definition for a leakage coefficient. Such definitions may include a ratio of some subset of the X coefficients other than X(1), to X(1), ratios of mathematical expressions found in individual X coefficients as real or imaginary parts to the magnitude X(1), or some monotonic function of the leakage coefficient $\eta$ of equation (3) or of a type just referred to above. Potential candidates for a leakage coefficient vanish when there is no deviation from the reference frequency f and increase rapidly and preferably linearly (for reduced execution time compared to nonlinear functions) with increasing frequency deviation $\Delta f$. The leakage coefficient $\eta$ satisfies all of these criteria.

In passing, it is noted that because the waveform 2 is a single-frequency sinusoid there is no problem of DFT aliasing effect, which is the phenomenon of true high-frequency components spuriously appearing as low frequency components when the unknown has multiple-frequency content. Likewise, the DFT picket-fence effect does not appear since the unknown not only has no harmonics but also lacks components of any frequency other than the fundamental. In the mathematical notation it is to be understood that double || vertical bars indicate the magnitude of a complex number ($|a+jb| = \sqrt{a^2+b^2}$), the symbols [] are brackets, j is the square root of minus one $\sqrt{-1}$, and pi $\pi$ is the ratio of the circumference of a circle to its diameter.

Calculation of Frequency Deviation from DFT Leakage

Since the unkown waveform 2 is a single-frequency sinusoid of unknown frequency deviation $\Delta f$, and the operation of the zero-crossing triggered A/D converter apparatus 6,7 constrains the digital representations to correspond to the analog values having a time relationship $\Delta t$ (38) and spacing $1/(nf)$ and number n, and the waveform 2 has some unknown amplitude V, then the sampled electrical values must be represented by $$V(i) = V \sin[2\pi(f - \Delta f)(\Delta t + (i/nf))] \tag{4}$$

Since the leakage coefficient $\eta$ is a ratio, the unknown amplitude V cancels out, so that by substituting Equation (4) into the leakage coefficient Equation (3) there arises $$\eta = \tag{5}$$

$$\frac{\left|\sum_{k=0}^{(n/2)-1} \left|\sum_{i=0}^{n-1} \sin[2\pi(1 - (\Delta f/f))(f\Delta t + (i/n))]e^{-j(2\pi/n)ik}\right|\right|}{\left|\sum_{i=0}^{n-1} \sin[2\pi(1 - (\Delta f/f))(f\Delta t + (i/n))]e^{-j(2\pi/n)i}\right|} - 1. \quad (5)$$

Unlike Equation (3) for calculating leakage coefficient from the known digital representations corresponding to the analog values, this Equation (5) involves the unknown frequency deviation $\Delta f$ which is to be measured. But since the value of leakage coefficient $\eta$ is able to be calculated for a given unknown waveform 2 by the CPU 10, and the quantities for the reference frequency f, offset interval $f\Delta t$ and the number n are all known constants, then the equation (5) is revealed to be an equation which can be solved for the frequency deviation $\Delta f$. The solution can be accomplished in general by known numerical techniques programmed into the computer 10,12. However, for many practical applications complex and time-consuming calculations are unnecessary since for small deviations in frequency Equation (5) can be linearized, and the particular leakage coefficient $\eta$ is found to be very advantageously near to linearity for not insubstantial departures from the reference frequency f.

For example, when n=32 and $f\Delta t$=0, implying that the sampling of the unknown waveform begins at the zero-crossing 21 itself and then occurs at 31 more points spaced $1/(32\times60)$ seconds apart, then the frequency deviation is related to the leakage coefficient $\eta$ by the simple expression (reference frequency f=60 Hz.):

$$\Delta f = \eta/0.095968085 \text{ Hertz}. \quad (6)$$

The numerical quantity for the slope in Equation (6) was obtained by a least-squares fit made to the nonlinear expression of Equation (5). This slope represents a difference of only 0.0071% from that calculated from the first and last points $\Delta f=0$ and $\Delta f=1.0$ Hz. on the Equation (5) itself.

For values of the offset 360° $f\Delta t$ between zero and forty degrees at reference frequency of f=60 Hz., the slope varies from the reciprocal of 0.095968085 to the reciprocal of roughly 0.90, with n=32. Linearity remains good as the slope changes more rapidly as the offset goes to 90°. With offset $f\Delta t$=0 the use of more points n for a given frequency deviation increases the leakage calculated and thus the obtainable accuracy. Linearity remains advantageous over a wide range of values of n.

When a person skilled in the art in practicing the invention employs a CPU 10 programmed with a leakage coefficient other than that defined in Equation (3), the procedure followed is that of substituting the sampled value equation (4) into the definition for leakage coefficient being used by the skilled worker analogous to Equation (3) and then solving the resulting equation analogous to Equation (5) either by numerical techniques or by linearizing.

Referring now to the Equation (3) definition of the leakage coefficient $\eta$, it is noted that the use of absolute values in that definition introduces an ambiguity as to the actual sign of the frequency deviation $\Delta f$. For example, a given leakage coefficient value from Equation (3) can correspond to a frequency deviation of the waveform 2 to a frequency higher than the reference frequency f or to a frequency lower than the reference frequency f. Of course, if a leakage coefficient not involving the use of all absolute values is employed then the ambiguity does not arise. Also, when the frequency departure is certain to be only in one direction, as in underfrequency relaying of AC electric power systems, an ambiguity is of relatively little consequence.

With regard to the leakage coefficient $\eta$ of Equation (3) the sign ambiguity is suitably resolved when necessary. Observation of the final sample V(n−1) is readily compared with the value it would have if the actual waveform 2 frequency were exactly at the reference frequency, namely V sin $[2\pi(f\Delta t+((n-1)/n))]$. Since V is the unknown amplitude of the unknown waveform 2, it is removed from the calculations by defining corresponding ratios $\phi_1 = V(n-1)/V(1)$ and $\phi_0 = \sin[2\pi(f\Delta t+((n-1)/n))]/\sin[2\pi(f\Delta t+1/n)]$. Then when the magnitude of $\phi_1$ exceeds the magnitude of $\phi_0$ and the leakage coefficient is not zero, then frequency deviation $\Delta f$ is negative in sign. Conversely, when the magnitude of $\phi_1$ is less than the magnitude of $\phi_0$ and the leakage coefficient is not zero, the frequency deviation $\Delta f$ is positive in sign.

The computed frequency deviation $\Delta f$ is then provided along output line 13 of CPU 10 in FIG. 1 to suitable display and recording means such as typewriter, CRT screen, chart recorder, tape, and so on (not shown).

FIG. 3 shows a simplified flowchart 60 of the program of the FFT leakage CPU 10. The program begins at starting point 50. Then a sequence is initiated at step 51 for the input of the n digital representations corresponding to zero-crossing 21, for instance. The digital representations are stored in memory 12 or in a scratchpad memory for use in the later steps. Next the n digital representations are used in step 52 in computing the FFT coefficient magnitudes X(k). In step 53 the leakage coefficient is calculated from the X(k) magnitudes according to Equation (2) after each X(k) has been computed in step 52 according to Equation (1).

Where the invention is being used for monitoring and protective purposes, a decision step 54 is provided. A LIMIT value corresponding to a value of leakage coefficient representing an excessive frequency deviation is stored in the computer 10 and if the actual calculated leakage coefficient exceeds LIMIT then output function 55 is executed in order to provide an output signal on line 14 to trip a relay, sound an alarm, or feed any of a variety of protective, display, or recording apparatus.

The program suitably next proceeds to step 56 for accurate computation of the frequency deviation $\Delta f$ from the leakage coefficient $\eta$ and the offset interval $f\Delta t$. If the offset interval can be held sufficiently constant in the design of the hardware and the sampling number n is constant, then the frequency deviation $\Delta f$ is directly calculated from the leakage coefficient. Also if the offset 360° $f\Delta t$ is kept less than forty degrees or so, regardless of any hardware variations, then accurate frequency deviation calculations can be made directly from the leakage coefficient. Otherwise, a more complex calculation is employed as by a table-lookup of slope or other solution of Equation (5).

In step 57 the frequency deviation $\Delta f$ is fed to display apparatus by output routines, whence the steps come to END 58. In continuous frequency monitoring, the CPU 10 returns to START 50 after executive program and threshold monitoring program functions 59, not shown, to repeat the cycle of calculations, of flowchart 60.

Approximately 12 milliseconds at a minimum are available on every other cycle of FIG. 2 in waveform 2 near 60 Hertz so as to provide plenty of time for the CPU 10 to execute the measurement routine of FIG. 3. The actual amount of time available is the shortest period 43 of a cycle of the unknown waveform 2, which has a frequency in the range 6/7 to 8/7 of 60 Hz. for proper triggering of the pulses in the specific apparatus of FIG. 4.

Figure 4:
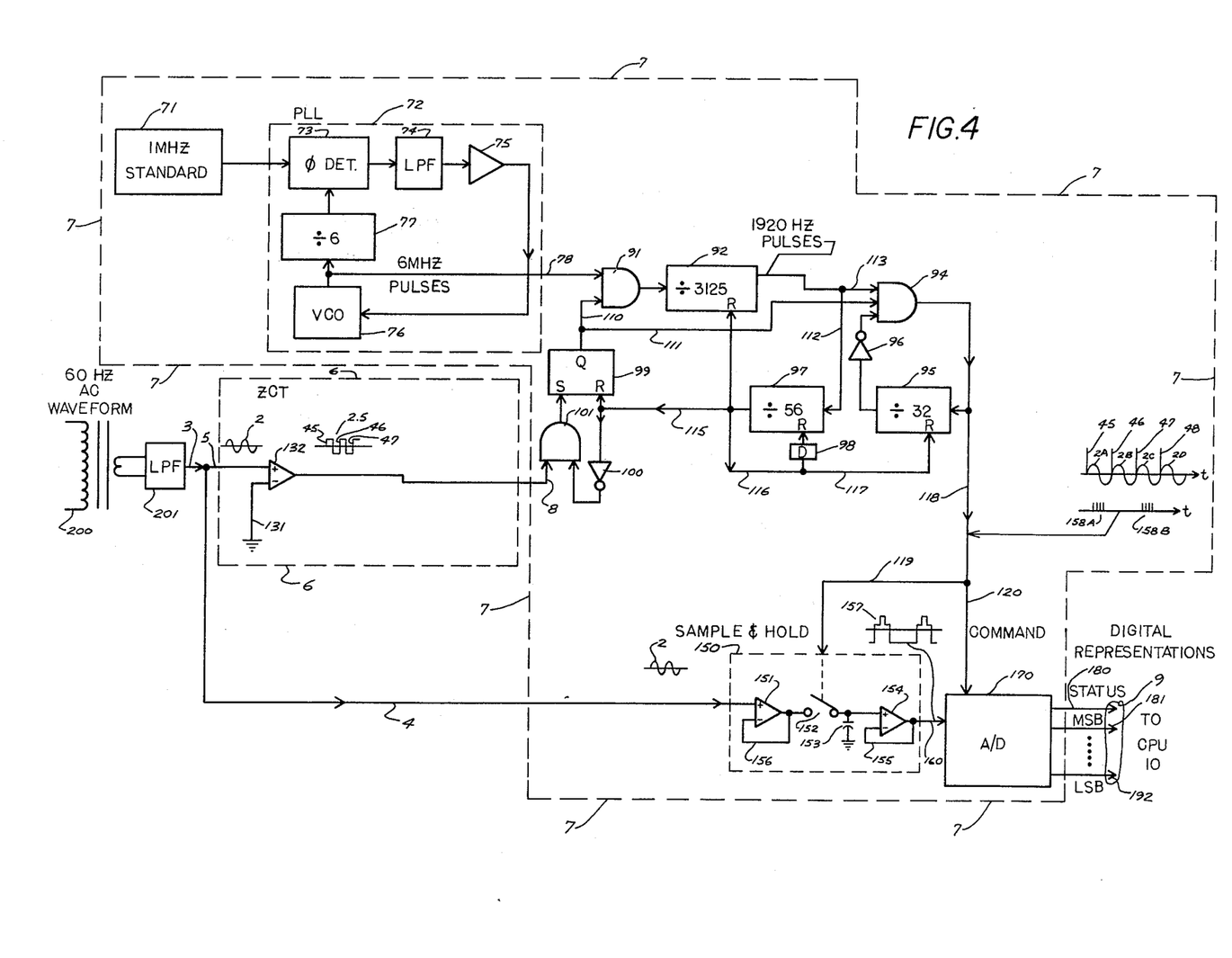
FIG. 4 is a partially schematic, partially block electrical circuit diagram of the analog-to-digital conversion apparatus arranged to provide data so that the leakage computed in FIG. 3 is useful for frequency measurement. It involves a zero-crossing trigger circuit driving an A/D converter for taking digital samples in a manner locked to the zero-crossings of the waveform.

In FIG. 4 a 60 Hz. AC waveform is stepped down by potential measuring transformer 200 and then stripped of harmonics by low pass filter 201. For the purpose a 4-pole active Butterworth low-pass filter is adequate. The cutoff frequency, or 3 dB down point is set at 80 Hz. No overall filter gain is necessary but an active filter is used to obtain high Q at the low frequency involved.

The fundamental frequency wave 2 being nominally 60 Hz. but having unknown frequency deviation passes on lead 5 to zero-crossing trigger circuit 6 and along lead 4 to analog-to-digital conversion apparatus 7. Fundamental wave 2 is sampled at 1920 Hz. by sample-and-hold circuit 150 of familiar commercially available type such as Analog Devices SHA-2A. In block form the sample-and-hold circuit 150 includes a unity-gain amplifier 151, sampling switch means of solid state type 152, analog sample-holding capacitor 153, and unity gain amplifier 154. Leads 155 and 156 provide appropriate feedback in order to obtain the unity gain. The samples held by capacitor 153 appear as stair-step output 157 on lead 160 with waiting during the every other cycle allocated to computations by the CPU 10.

Analog-to-digital converter 170 is any suitable A/D converter integrated circuit of commercially available type such as the Analog Devices ADC572 for providing digital representations of any analog voltage present on input lead 160 when a Command pulse is provided on lead 120. The digital representations are provided in appropriate encoding such as simple binary or binary-coded-decimal (BCD) compatible with CPU 10, with bits ranging from the MSB most-significant-bit line 181 to the least-significant-bit line LSB 192. A STATUS line 180 from A/D circuit 170 is suitably used to alert the CPU 10 that the converter 170 is ready or not ready to provide the digital representation corresponding to the latest sample value. Buss 9 carries the STATUS information and the parallel binary bits of each digital representation to CPU 10 which inputs, stores, and manipulates the digital representations of the sample data according to the FFT leakage program therein.

The clock reference is provided by a frequency standard 71 suitably running at 1 MHz. and suitably being a rubidium vapor standard driving a phase-lock-loop 72 for providing 6 MHz. pulses at output line 78. The rubidium standard is previously calibrated against a primary standard such as a cesium beam standard but once calibrated it has excellent long term stability. The phase-lock-loop 72 is any suitable commercially available type such as the Signetics NE564 and such as one utilizing a voltage-controlled oscillator 76 driving a divide-by-six counter 77 driving phase detector 73. The detector 73 locks VCO 76 via low pass filter 74 and amplifier 75 to the sixfold frequency of 6 MHz.

When sampling is triggered, the 6 MHz. pulses on line 78 pass through AND-gate 91 to divide-by-3125 counter 92. Each of the dividing counters described herein is of any suitable type such as a binary counter having enough bits to count up at least to the number of division, logic circuitry to detect when the number is reached and then reset the counter to zero so it can begin counting up again.

After division by 3125, pulses of length 100 nanoseconds are recurring at the sampling frequency of 1920 Hz. which is 32 times the reference frequency of 60 Hz. Thus n=32. When AND-gate 94 is passing sampling pulses divide-by-32 counter 95 permits a group 158A of 32 pulses to pass on line 118 before counter 95 shuts AND-gate 94 off by inverting amplifier 96. In the meantime divide-by-56 counter 97 counts for an additional 24 pulses of dead-time for CPU 10 before resetting counter 92, counter 95, flip-flop 99, AND-gate 101 through inverter 100, and itself through delay 98. Delay 98 is suitably set to be less than or approximately equal to the length of time between two sampling pulses, 1/(nf), but this is not critical.

Zero-crossing trigger circuit 6 is a fast high-gain amplifier 132 suitably being the commercially available Signetics uA711. Amplifier 132 provides a square pulse train 2.5 such that flip-flop 99 is triggered and set on leading edges 45, 47 simultaneous with zero-crossings 21 and 25 of waveform 2. A trigger circuit 6 which produces pulses beginning at a zero-crossing and having a duty cycle from near zero (as in FIG. 2) up to 50% or so (as in train 2.5) is satisfactory. These pulses pass through AND-gate 101 to set flip-flop 99 and initiate a new group of n sampling pulses 158B every other cycle when counter 97 permits. The pulse groups 158A and 158B operate the sample-and-hold circuit 150 and the A/D converter 170 on lines 119 and 120.

Looking at FIG. 4 as a whole, the circuitry of block 7 other than the A/D converter 170 is a sample-and-hold amplifier 150 driven by circuitry for producing the sampling pulse groups 158. The sampling pulse circuitry and sample-and-hold amplifier 150 act to sample waveform 2 at a rate equal to a multiple of 32 times the 60 Hz. reference frequency or 1920 Hz. and they respond to every other trigger signal 45, 47, etc. to produce exactly 32 analog samples 157 on line 160 having the 32 electrical values $V(0), V(1), V(2), V(3), \ldots V(31)$ which are converted to digital form by A/D converter 170. By virtue of the hardware construction of detector 6 and conversion unit 7, the first analog sample V(0) (point 22.0) is always located at the same fraction $f\Delta t$ (being 1° or less in FIG. 4) reference cycles relative to the zero-crossing (21) nearest the triggering signal 45 for every cycle which is sampled from the waveform 2.

In another way of looking at the apparatus of FIG. 4 the sample-and-hold amplifier 150 and the A/D converter circuit 170 together form a circuit responsive to waveform 2 for producing a digital representation of one of the electrical values anywhere on the waveform 2 when a command pulse in the group 158A, 158B, etc. is applied on line 118.

The balance of the circuitry in conversion unit 7 (71,72,91,92,94,95,96,97,98,99,100,101) responds to every other triggering pulse from detector 6 so as to provide groups of 32 command pulses to the circuitry 150,170 such that the 32 command pulses recur at a rate equal to 32 times the reference frequency of 60 Hz., or 1920 Hz. and such that the timewise first one of the command pulses in each group such as 158A, is always the same fraction $f\Delta t$ ($60\Delta t$) of a reference cycle relative to the zero crossing 21 nearest triggering signal 45.

In this way the circuitry 150,170 is controlled so as to produce the digital representations in the correct number corresponding to analog values equally and correctly spaced in the waveform 2 and in a constant time relationship to the zero-crossing subsequent to which sampling is to commence.

Figure 5:
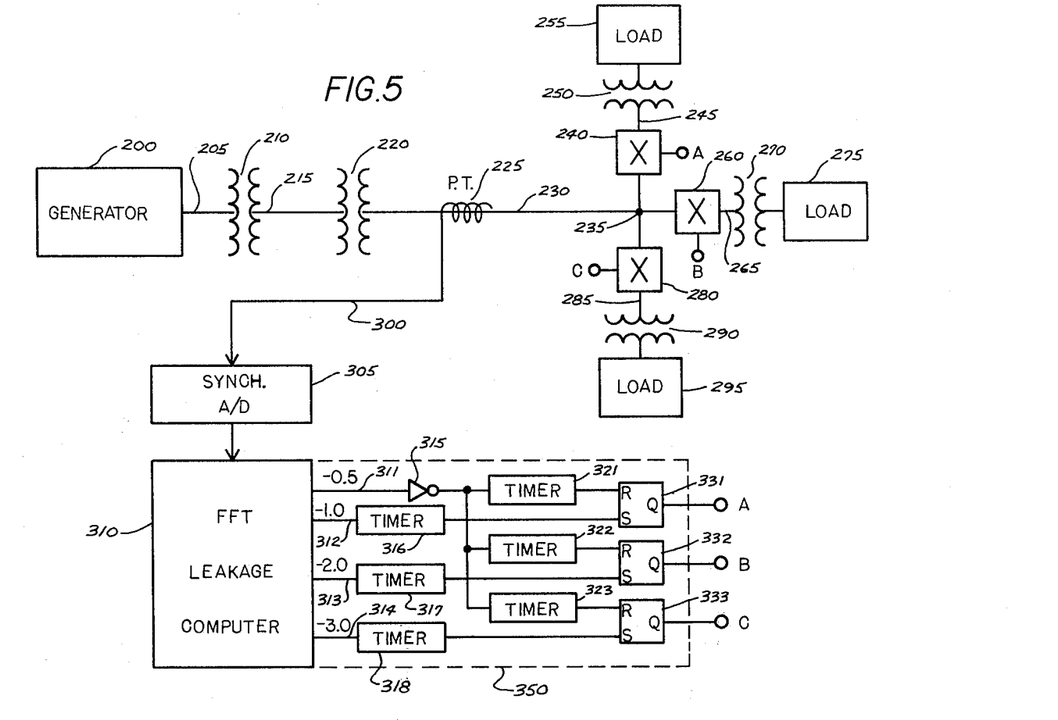
FIG. 5 is a block diagram of a self-protecting AC power generation, transmission, and distribution system of the invention utilizing Fourier-transform-based protective relaying and frequency stabilization. The inventive combination of FIG. 5 utilizes the inventive subcombination of FIG. 1 and a form of the inventive method.

FIG. 5 illustrates an application of the invention in several of its aspects in a protectable, frequency self-stabilizing AC power system. 60 Hz. AC electric power generator 200 produces 3-phase power which is conducted along 3-phase power transmission line 205 to step-up generator transformer 210 at or near the powerhouse location of generator 200. Higher-voltage AC power is next carried along transmission line 215 for typically a distance of several miles to substation 3-phase step-down transformer 220. At the substation the voltage from one of the phases of transmission line 230 is coupled by means of potential transformer 225 along line 300 to frequency deviation measurement apparatus involving zero-crossing synchronized analog-to-digital conversion apparatus 305 (same as detector 6 and conversion unit 7 of FIG. 1) and FFT leakage computer 310 (same as CPU 10 and memory 11 of FIG. 1 except more threshold comparisons of measured deviation). For details of the deviation measurement apparatus 305,310 refer to FIGS. 1,2,3, and 4 and description thereof hereinabove.

3-phase AC power is conducted in the substation location along transmission line 230 to tie 235 which is connected to circuit breakers 240,260, and 280, which are in turn respectively connected to transmission lines 245,265, and 285. These fan out from the substation to local points at which three-phase transformers 250,270, and 290 step the voltage down still further to distribution levels and feed single-phase lines, distribution transformers, and ultimate energy consumption devices. The lines, transformers, and consumption devices are loads 255,275, and 295.

Transmission lines 205,215, and 230 are able to carry electrical energy having an AC frequency influenceable by the number of energy-receiving transmission lines 245,265, and 285 which are disconnectably connected to line 230 by means of circuit breakers 240,260, and 280 and permitted to receive electrical energy from generator 200 by the circuit breakers. This is because the loading provided over lines 245, 265, and 285 creates an energy demand on the generator 200. Sudden changes in the system loading cause the generator 200 to slow down until control apparatus not shown at generator 200 provides more motive power to bring generator speed and system frequency back up to the nominal 60 Hz. system frequency.

Each circuit breaker in normal system operation completes a connection and permits energy to flow to the loads 255, 275, and 295. When the system is disrupted by an amount of energy demand which loads down the system frequency, however, load-shedding is temporarily required and one or more circuit breakers are actuated by electrical breaker signals at A,B, and C to trip them out.

From a feedback stabilization point of view the leakage coefficient η, frequency deviation Δf, threshold comparison signals on lines 312,313,314, or signals at A,B, or C can be regarded as error signals provided by monitor apparatus 305,310 to apparatus 240,260,280,255,275,295 for adjusting the loading on and frequency of generating apparatus 200,210,220,230.

Automatic management of a system disruption so as to provide load-shedding and reconnection is provided by frequency deviation monitor 305,310 and shedding management apparatus 350. The FFT leakage computer operates in the same way as computer 10, 12 of FIG. 1 and flowchart of FIG. 3 except that four threshold values of frequency deviation are programmed into computer 310 for comparison purposes. The reference frequency of the monitoring apparatus 305,310 is arranged to be the same 60 Hz. as the nominal system frequency.

When the leakage coefficient computed indicates an underfrequency of 0.5 Hz. (59.5 Hz. or less) the computer outputs a pulse on line 311 for each cycle which is underfrequency by that much. When the leakage coefficient computed indicates an underfrequency in excess of a magnitude of 1.0 Hz. (59.0 Hz. or less), 2.0 Hz. (58.0 Hz. or less), and 3.0 Hz. (57.0 Hz. or less) the computer outputs respective control or monitor pulses on lines 312, 313, or 314 corresponding to each cycle which underfrequency by that much. Long, medium, and short timers 316, 317, and 318 respectively output a pulse to set terminals of flip-flops (or latching relays) 331,332, and 333 to respectively turn on lines A,B, and C and actuate and trip out breakers 240, 260, and 280.

Inverting amplifier 315 feeds long, medium, and short timers 321, 322, and 323 which in turn reset the flip-flops 331,332, and 333 to reconnect the system after the frequency has come back up above 59.5 Hz. One, two, or all three circuit breakers are tripped out depending on the 1.0, 2.0, or 3.0 Hz. underfrequency the system reaches in a disruption.

Figure 6:
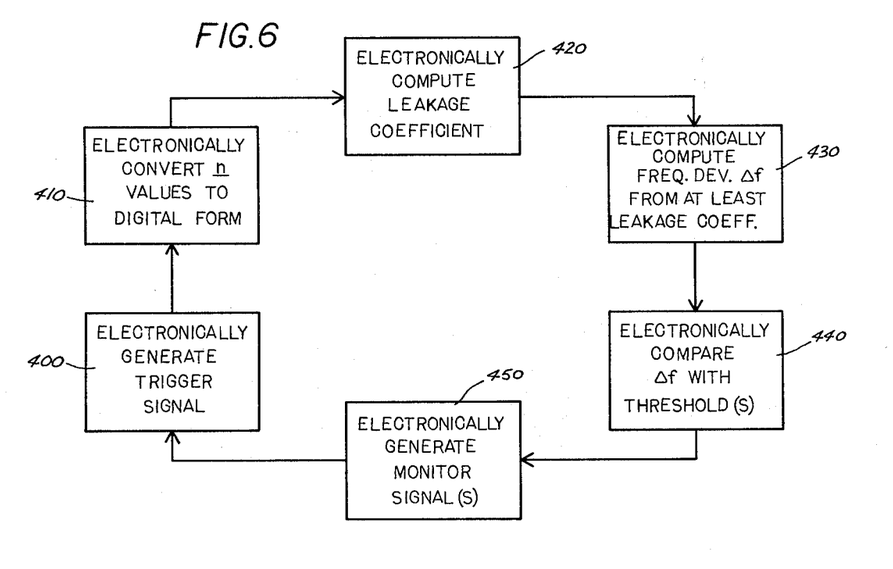
FIG. 6 is a block diagram of a form of the inventive method for monitoring instantaneous frequency of a fundamental frequency wave.

FIG. 6 shows the sequence of steps of an embodiment of the method aspects of the present invention. In response to a zero-crossing, a trigger signal is electronically generated in step 400. In response to the trigger signal, step 410 is commenced and initiated in which the number n of electrical values of the single-frequency sinusoidal waveform occurring in a period 1/f of the reference frequency are electronically converted to digital form so as to produce the n digital representations.

Next, step 420 occurs to electronically compute a leakage coefficient of the DFT by hardware, firmware, or software. In step 430 the frequency deviation is subsequently electronically computed from the leakage coefficient or otherwise such that the computed frequency deviation is accurate in view of the number n and offset fraction fΔt whether the latter quantities appear in the calculations or not.

In step 440 the measured frequency deviation of step 430 is compared with each threshold value being utilized for monitoring purposes. Finally in step 450 a monitoring signal such as a pulse is electronically generated for each threshold exceeded by the measured frequency deviation in step 440.

The method is executed repetitively by beginning at step 400 on the next cycle of the unknown waveform to be measured and repeating the steps 400,410,420,430,440,450, so as to produce a succession of leakage coefficient values, and frequency deviation values. In turn there are produced a succession of monitor signals, or a continuous monitor signal, in response to the succession of zero-crossings, for as long as a given threshold is exceeded. In the process each of the succession of values of measured frequency deviation or leakage coefficient is suitably compared electronically with a limit value of frequency deviation, or leakage coefficient, and a monitor signal is generated dependent on whether the deviation is higher or lower than the limit value.

In all cases it is to be understood that the hereinabove-described preferred embodiments, arrangements, apparatus, methods, and systems are simply illustrative of a small number of the many possible specific embodiments and methods which can represent applications of the principles of the invention. Numerous and varied other arrangements, embodiments, apparatus, methods, and systems can readily be devised in accordance with these principles by those skilled in the art without departing from the spirit and scope of the invention and so that the utility of the invention can be fully realized.

What is claimed is:

1. Apparatus for measurement, relative to a reference frequency f, of frequency deviation $\Delta f$ of frequency of a substantially single-frequency sinusoidal waveform having electrical values including zero-crossings and being provided to said apparatus, said apparatus comprising:

means for generating triggering signals, each triggering signal being in response to a respective one of at least some of said zero-crossings of said waveform;

converting means being responsive to said waveform and to said each said triggering signal so that said converting means produces n digital representations, n being a whole number of at least 4, corresponding to n electrical values of said waveform occurring during a period 1/f of the reference frequency, one of said n digital representations corresponding to a time-wise first one of said n electrical values, said first one value being located $f\Delta t$ reference cycles relative to the zero-crossing nearest said each said triggering signal, $\Delta t$ being a time interval; and stored program computing means for receiving said n digital representations and computing a leakage coefficient of the discrete Fourier transform of said n digital representations and then computing the measured frequency deviation $\Delta f$ from at least the leakage coefficient so that the frequency deviation so computed is substantially accurate in view of the number n and the quantity $f\Delta t$.

2. Measurement apparatus as claimed in claim 1 wherein said converting means comprises means for sampling said waveform at a rate equal to a multiple of said reference frequency f, said multiple being equal to said whole number n times f, said sampling means being responsive to said each said triggering signal so as to produce exactly n analog samples having said n electrical values and so that the timewise first one of said analog samples is always located the same said $f\Delta t$ reference cycles relative to the zero-crossing nearest said each said triggering signal; and means for producing said n digital representations from said n analog samples.

3. Measurement apparatus as claimed in claim 1 wherein said converting means comprises means responsive to said waveform for producing a digital representation of any one of said electrical values of said waveform in response to a command pulse; and means responsive to said each said triggering signal for providing exactly n command pulses to said digital producing means such that said n command pulses recur at a rate equal to n times the reference frequency f and such that the timewise first one of said command pulses is always the same said $f\Delta t$ reference cycles relative to the zero-crossing nearest said each said triggering signal, whereby said digital producing means produces said n digital representations.

4. Measurement apparatus as claimed in claim 1 wherein said triggering signal generating means, and said converting means cooperate so that said timewise first one of said n electrical values corresponding to a digital representation is always located less than the fraction 40/360 of one cycle of the reference frequency ($f\Delta t < 40/360$) relative to the zero-crossing nearest said each said triggering signal; and said computing means computes the measured frequency deviation as proportional to the leakage coefficient and independent of the quantity $f\Delta t$.

5. Measurement apparatus as claimed in claim 4 wherein the reference frequency is 60 Hertz, the number n is 32, and the computing means computes the measured frequency deviation as equal to the leakage coefficient multiplied by a proportionality constant equal to the reciprocal of a number between 0.090 and 0.096.

6. Measurement apparatus as claimed in claim 1 wherein said n digital representations correspond to the n electrical values being V(i), where i=0,1,2, ... n−1, n being evenly divisible by two;

the leakage coefficient $\eta$ of the discrete Fourier transform computed by said computing means is substantially equal to $$\eta = \frac{\sum_{k=0}^{(n/2)-1} \left| \sum_{i=0}^{n-1} V(i)e^{-j(2\pi/n)ik} \right|}{\left| \sum_{i=0}^{n-1} V(i)e^{-j(2\pi/n)i} \right|} - 1$$

and the measured frequency deviation $\Delta f$ computed by said computing means is substantially equal to the solution for $\Delta f$ of the equation $$\eta = \frac{\sum_{k=0}^{(n/2)-1} \left| \sum_{i=0}^{n-1} \sin[2\pi(1-(\Delta f/f))(f\Delta t + (i/n))]e^{-j(2\pi/n)ik} \right|}{\left| \sum_{i=0}^{n-1} \sin[2\pi(1-(\Delta f/f))(f\Delta t + (i/n))]e^{-j(2\pi/n)i} \right|} - 1.$$

7. Electrical power relaying apparatus comprising apparatus for measurement, relative to a reference frequency f, of frequency deviation $\Delta f$ of frequency of a substantially single-frequency sinusoidal waveform having electrical values including zero-crossings and being provided to said measurement apparatus, said measurement apparatus comprising means for generating triggering signals, each triggering signal being in response to a respective one of at least some of said zero-crossings of said waveform;

converting means being responsive to said waveform and to said each said triggering signal so that said converting means produces n digital representations, n being a whole number of at least 4, corresponding to n electrical values of said waveform occurring during a period 1/f of the reference frequency, one of said n digital representations corresponding to a timewise first one of said n electrical values, said first one value being located fΔt reference cycles relative to the zero-crossing nearest said each said triggering signal, Δt being a time interval; and stored program computing means for receiving said n digital representations and computing a leakage coefficient of the discrete Fourier transform of said n digital representations and then computing the measured frequency deviation Δf from at least the leakage coefficient so that the frequency deviation so computed is substantially accurate in view of the number n and the quantity fΔt;

said electrical power relaying apparatus further comprising circuit breaking means capable of being actuated by an electrical breaker signal, said computing means of said frequency deviation measurement apparatus further comparing said measured frequency deviation with at least one threshold frequency deviation quantity and producing said electrical breaker signal so as to actuate said circuit breaking means when said measured frequency deviation exceeds said threshold frequency deviation quantity in magnitude.

8. Protectable electrical power system apparatus comprising a plurality of means for receiving electrical energy;

circuit breaker means connected to at least some of said plurality of energy-receiving means, each said circuit breaker means being able to disconnect one of said plurality of energy-receiving means when said each said circuit breaker means is fed a respective electrical breaker signal;

transmission line means connected to said circuit breaker means, said transmission line means being able to carry electrical energy having an alternating current frequency influenceable by the number of said plurality of energy-receiving means being permitted to receive said electrical energy by said circuit breaker means; and frequency deviation measurement apparatus being apparatus for measurement, relative to a reference frequency f, of frequency deviation Δf of frequency of a substantially single-frequency sinusoidal waveform having electrical values including zero-crossings and being provided to said frequency deviation measurement apparatus, said frequency deviation measurement apparatus comprising means for generating triggering signals, each triggering signal being in response to a respective one of at least some of said zero-crossings of said waveform;

converting means being responsive to said waveform and to said each said triggering signal so that said converting means produces n digital representations, n being a whole number of at least 4, corresponding to n electrical values of said waveform occurring during a period 1/f of the reference frequency, one of said n digital representations corresponding to a timewise first one of said n electrial values, said first one value being located fΔt reference cycles relative to the zero-crossing nearest said each said triggering signal, Δt being a time interval; and stored program computing means for receiving said n digital representations and computing a leakage coefficient of the discrete Fourier transform of said n digital representations and then computing the measured frequency deviation Δf from at least the leakage coefficient so that the frequency deviation so computed is substantially accurate in view of the number n and the quantity fΔt;

said frequency deviation measurement apparatus being coupled to said transmission line means so that said alternating current frequency is provided to said frequency deviation measurement apparatus as said substantially single-frequency sinusoidal waveform having electrical values including zero-crossings, said frequency deviation measurement apparatus comparing said measured frequency deviation with a plurality of threshold frequency deviation quantities so as to produce and feed each said respective electrical breaker signal to said circuit breaking means so that more energy-receiving means are disconnected by said circuit breaking means when the magnitude of said measured frequency deviation is at at least one higher level than when the magnitude of said measured frequency deviation is at at least one lower level, whereby said at least some of said energy-receiving means are able to be shed and said power system apparatus is protectable.

9. Protectable electrical power system apparatus comprising means for generating electrical energy having a frequency deviation, relative to a nominal system frequency, dependent upon an amount of energy demand on said generating means;

a plurality of electrical energy transmission line means for providing said energy demand to said generating means;

circuit breaker means connected to at least some of said plurality of transmission line means, each said circuit breaker means connecting one of said transmission line means to said generating means and being able to disconnect said one of said transmission line means when said each said circuit breaker means is tripped by a respective breaker signal; and frequency deviation measurement apparatus being apparatus for measurement, relative to a reference frequency f, of frequency deviation Δf of frequency of a substantially single-frequency sinusoidal waveform having electrical values including zero-crossings and being provided to said frequency deviation measurement apparatus, said frequency deviation measurement apparatus comprising means for generating triggering signals, each triggering signal being in response to a respective one of at least some of said zero-crossings of said waveform;

converting means being responsive to said waveform and to said each said triggering signal so that said converting means produces n digital representations, n being a whole number of at least 4, corresponding to n electrical values of said waveform occurring during a period 1/f of the reference frequency, one of said n digital representations corresponding to a timewise first one of said n electrical values, said first one value being located fΔt reference cycles relative to the zero-crossing nearest said each said triggering signal, Δt being a time interval; and stored program computing means for receiving said n digital representations and computing a leakage coefficient of the discrete Fourier transform of said n digital representations and then computing the measured frequency deviation Δf from at least the leakage coefficient so that the frequency deviation so computed is substantially accurate in view of the number n and the quantity fΔt;

said frequency deviation measurement apparatus being coupled to said generating means so as to measure said generating means frequency deviation, said reference frequency f of said measurement apparatus being substantially equal to said nominal system frequency, said frequency deviation measurement apparatus comparing said measured frequency deviation of said generating means with a plurality of threshold frequency deviation quantities so as to produce each said respective breaker signal to trip said circuit breaker means so that more of said transmission line means are disconnected by said circuit breaker means when the magnitude of said measured frequency deviation of said generating means is at at least one higher level than when the magnitude of said measured frequency deviation is at at least one lower level, whereby said at least some of said plurality of transmission line means are able to be sequentially shed and said power system apparatus is protectable.

10. Protective apparatus for signalling excessive frequency deviation, from a standard frequency f, of an alternating current waveform having a fundamental frequency wave, said fundamental frequency wave having zero-crossings, said protective apparatus comprising zero-crossing detector means for producing triggering pulses corresponding to at least some of said zero-crossings of said fundamental frequency wave;

analog-to-digital converter means responsive to said fundamental frequency wave and to each of said triggering pulses from said zero-crossing detector so that said converter produces a number n of binary values corresponding to the same number n of analog values of said fundamental frequency wave occurring after a zero-crossing and during a time period of a cycle of the standard frequency f, the converter acting so that a time interval being from each zero-crossing corresponding to a trigger pulse and the first analog value of said fundamental frequency wave converted to binary form in response to said trigger pulse is substantially the same for every trigger pulse; and means for computing the discrete Fourier transform of said n binary values and then computing a leakage coefficient equal to the ratio of the amount of at least some of spuriously calculated frequency content other than at the standard frequency f divided by the magnitude of the calculated frequency component corresponding to the standard frequency f, said computing means producing at least one electrical control signal when the magnitude of said ratio exceeds a threshold value, whereby said apparatus produces said control signal and so signals excessive frequency deviation of the fundamental frequency wave from the standard frequency f suitable for electrical system protection purposes.

11. Apparatus for protecting an electrical power system having a system loading and having an alternating current power waveform having a fundamental frequency being influenceable by the system loading, said apparatus comprising protective apparatus for signalling excessive frequency deviation, from a standard frequency f, of an alternating current waveform having a fundamental frequency wave, said fundamental frequency wave having zero-crossings, said protective apparatus for signalling excessive frequency deviation comprising zero-crossing detector means for producing triggering pulses corresponding to at least some of said zero-crossings of said fundamental frequency wave;

analog-to-digital converter means responsive to said fundamental frequency wave and to each of said triggering pulses from said zero-crossing detector so that said converter produces a number n of binary values corresponding to the same number n of analog values of said fundamental frequency wave occurring after a zero-crossing and during a time period of a cycle of the standard frequency f, the converter acting so that a time interval being from each zero-crossing corresponding to a trigger pulse and the first analog value of said fundamental frequency wave converted to binary form in response to said trigger pulse is substantially the same for every trigger pulse; and means for computing the discrete Fourier transform of said n binary values and then computing a leakage coefficient equal to the ratio of the amount of at least some of the spuriously calculated frequency content other than at the standard frequency f divided by the magnitude of the calculated frequency component corresponding to the standard frequency f, said computing means producing at least one electrical control signal when the magnitude of said ratio exceeds a threshold value, whereby said protective apparatus for signalling excessive frequency deviation produces said control signal and so signals excessive frequency deviation of the fundamental frequency wave from the standard frequency f suitable for electrical system protection purposes;

means for coupling said alternating current power waveform to said protective signalling apparatus, said coupling means including low-pass filter means for passing only a waveform being said fundamental frequency wave; and means for changing the system loading in response to said at least one electrical control signal of said protective signalling apparatus so as to reduce the magnitude of the frequency deviation of the fundamental frequency wave from the standard frequency f.

12. Protecting apparatus as claimed in claim 11 wherein protective signalling apparatus computing means compares said ratio with a plurality of threshold values and produces additional electrical control signals when the magnitude of said ratio exceeds each of said plurality of threshold values; and said means for changing the system loading is responsive to each of said additional electrical control signals so as to reduce the magnitude of the frequency deviation of the fundamental frequency wave from the standard frequency f.

13. Apparatus for measurement, relative to a reference frequency f, of frequency deviation Δf of the fundamental frequency of an electrical waveform provided to said apparatus, said frequency deviation measurement apparatus comprising:

filter means for passing substantially only the fundamental frequency waveform of said electrical waveform provided to said apparatus for frequency deviation measurement thereof, said fundamental frequency waveform having zero-crossings;

means for detecting said zero-crossings and generating a trigger signal corresponding to at least some of said zero-crossings;

means for sampling said fundamental frequency waveform at a rate equal to an integer multiple n of said reference frequency f, said multiple n being greater than or equal to 4, said sampling means being triggered by said zero-crossing detector means so as to obtain n analog samples of said fundamental frequency waveform, the first of said samples being located f$\Delta$t cycles relative to the nearest of said zero-crossings, where $\Delta$t is a time interval;

means for converting said n analog samples to n digital representations of said samples; and stored program computing means for computing the leakage coefficient of the discrete Fourier transform of said n digital representations and then computing the measured frequency deviation $\Delta$f from the leakage coefficient in a manner corresponding to the value of said f$\Delta$t cycles.

14. In a method of measurement of frequency deviation $\Delta$f, of a substantially sinusoidal analog waveform having zero-crossings and electrical values, from a reference frequency f the steps of electronically generating a triggering signal in response to one of said zero-crossings of said waveform;

electronically converting a number n of said electrical values of said sinusoidal analog waveform to digital representations by producing n said digital representations, n being greater than or equal to 4, corresponding to said number n of the electrical values of said waveform occurring during a period 1/f of the reference frequency subsequent to said one of said zero-crossings, one of said n digital representations corresponding to a timewise first one of said n electrical values, said first one value being located a fraction f$\Delta$t of one reference cycle relative to said one of said zero-crossings, said triggering signal initiating said converting step;

electronically computing a leakage coefficient of the discrete Fourier transform of said n digital representations; and electronically computing the measured frequency deviation $\Delta$f from at least said leakage coefficient so that the frequency deviation so computed is substantially accurate in view of the number n and the fraction f$\Delta$t.

15. A method of repetitive measurement of frequency deviation $\Delta$f, of a substantially sinusoidal analog waveform having zero-crossings and electrical values, from a reference frequency f, said method comprising successively repeating a second method comprising the steps of A. electronically generating a triggering signal in response to one of said zero-crossings of said waveform;

B. electronically converting a number n of said electrical values of said sinusoidal analog waveform to digital representations by producing n said digital representations, n being greater than or equal to 4, corresponding to said number n of the electrical values of said waveform occurring during a period 1/f of the reference frequency subsequent to said one of said zero-crossings, one of said n digital representations corresponding to a timewise first one of said n electrical values, said first one value being located a fraction f$\Delta$t of one reference cycle relative to said one of said zero-crossings, said triggering signal initiating said converting step;

C. electronically computing a leakage coefficient of the discrete Fourier transform of said n digital representations; and D. electronically computing the measured frequency deviation $\Delta$f from at least said leakage coefficient so that the frequency deviation so computed is substantially accurate in view of the number n and the fraction f$\Delta$t;

said second method being so successively repeated that said steps are performed in response to successive ones of at least some of said zero-crossings of said sinusoidal analog waveform thereby resulting in computing a succession of values of measured frequency deviation $\Delta$f.

16. A method of monitoring frequency deviation $\Delta$f, of a substantially sinusoidal analog waveform having zero-crossings and electrical values, from a reference frequency f, comprising successively repeating a second method comprising the steps of A. electronically generating a triggering signal in response to one of said zero-crossings of said waveform;

B. electronically converting a number n of said electrical values of said sinusoidal analog waveform to digital representations by producing n said digital representations, n being greater than or equal to 4, corresponding to said number n of the electrical values of said waveform occurring during a period 1/f of the reference frequency subsequent to said one of said zero-crossings, one of said n digital representations corresponding to a timewise first one of said n electrical values, said first one value being located a fraction f$\Delta$t of one reference cycle relative to said one of said zero-crossings, said triggering signal initiating said converting step;

C. electronically computing a leakage coefficient of the discrete Fourier transform of said n digital representations; and D. electronically computing the measured frequency deviation $\Delta$f from at least said leakage coefficient so that the frequency deviation so computed is substantially accurate in view of the number n and the fraction f$\Delta$t;

said second method being so successively repeated that said steps are performed in response to successive ones of at least some of said zero-crossings of said sinusoidal analog waveform thereby resulting in computing a succession of values of measured frequency deviation $\Delta$f;

said frequency deviation monitoring method further comprising the steps of electronically comparing each of said succession of values of measured frequency deviation $\Delta$f with a limit value of frequency deviation; and electronically generating a monitor signal dependent upon whether said measured frequency deviation is higher or lower than said limit value.

17. In a method of monitoring over time an analog waveform having zero-crossings and electrical values the steps of electronically sensing successive ones of at least some of said zero-crossings and in response to each of said successive ones electronically converting a respective group of n of said electrical values of said analog waveform to digital representations, said electrical values in each group having a spacing 1/(nf) and including an initial electrical value in each said group always being the same time interval $\Delta t$ relative to its respective one of said at least some of said zero-crossings, f being a reference frequency and n being a whole number at least 4; and electronically computing a leakage coefficient of the discrete Fourier transform of each group of n digital representations to produce a succession of computed leakage coefficient values, whereby said leakage coefficient values are related to a frequency deviation $\Delta f$ from said reference frequency f and said succession of leakage coefficient values effectively provides a monitoring of instantaneous frequency of said analog waveform.

18. The method of claim 17 wherein said method further comprises the steps of electronically comparing said succession of leakage coefficient values with at least one threshold value and generating a monitor signal dependent on the comparing of said leakage value to said threshold value.

19. Apparatus for monitoring over a period of time an analog waveform having zero-crossings and electrical values, the apparatus comprising means for electronically sensing successive ones of at least some of said zero-crossings and in response to each of said successive ones electronically converting a respective group of n of said electrical values of said analog waveform to digital representations, said electrical values in each group having spacing 1/(nf) and including an initial electrical value in each said group always being the same time interval $\Delta t$ relative to its respective one of at least some of said zero-crossings, f being a reference frequency and n being a whole number at least 4; and means for electronically computing a leakage coefficient of the discrete Fourier transform of each group of n digital representations to produce a succession of computed leakage coefficient values, whereby said leakage coefficient values are related to a frequency deviation $\Delta f$ from said reference frequency f and said succession of leakage coefficient values effectively provides a monitoring of instantaneous frequency of said analog waveform.

20. Monitoring apparatus as claimed in claim 19 wherein said apparatus further comprises means for electronically comparing said succession of leakage coefficient values with at least one threshold value and generating a monitor signal dependent on the comparison of said leakage value to said threshold value.

21. Apparatus for stabilizing the frequency of an analog waveform having zero-crossings and electrical values, the apparatus comprising means for generating said analog waveform at and near a reference frequency f, the difference in the actual frequency of said generating means and the reference frequency f being a frequency deviation $\Delta f$;

means for affecting the generating means being connected to said generating means so as to adjust the actual frequency of said generating means to reduce the magnitude of the frequency deviation $\Delta f$ in response to at least one error signal provided to said adjusting means; and means for monitoring over a period of time said analog waveform, comprising means for electronically sensing successive ones of at least some of said zero-crossings and in response to each of said successive ones electronically converting a respective group of n of said electrical values of said analog waveform to digital representations, said electrical values in each group having spacing 1/(nf) and including an initial electrical value in each said group always being the same time interval $\Delta t$ relative to its respective one of at least some of said zero-crossings, f being the reference frequency and n being a whole number at least 4; and means for electronically computing a leakage coefficient of the discrete Fourier transform of each group of n digital representations to produce a succession of computed leakage coefficient values, whereby said leakage coefficient values are related to said frequency deviation $\Delta f$ from said reference frequency f and said succession of leakage coefficient values effectively provides a monitoring of instantaneous frequency of said analog waveform;

said monitoring means being coupled to said generating means for monitoring the analog waveform of said generating means, said succession of computed leakage coefficient values produced by said monitoring means being able to be used by said monitoring means to produce said at least one said error signal and said monitoring means being connected to said adjusting means so as to provide said error signal to said adjusting means, whereby the frequency of said analog waveform is able to be stabilized.

* * * * *